United States Patent [19]

Beane

[11] Patent Number: 5,215,140
[45] Date of Patent: Jun. 1, 1993

[54] METHOD OF MAKING A HEAT SINK

[75] Inventor: Glenn Beane, Plymouth, N.H.

[73] Assignee: MI Propruetart, Concord, N.H.

[21] Appl. No.: 609,267

[22] Filed: Nov. 5, 1990

[51] Int. Cl.⁵ ............................................. B22D 18/06
[52] U.S. Cl. ......................................... 164/65; 164/63
[58] Field of Search ............................ 164/61, 63, 65

[56] References Cited

FOREIGN PATENT DOCUMENTS 59-47044 3/1984 Japan ..................................... 164/63
253160 11/1986 Japan ..................................... 164/65

OTHER PUBLICATIONS

R. M. German, *Powder Metallurgy Science*, Metal Powder Industries Foundation, Princeton, N.J., 1984.

Primary Examiner—Richard K. Seidel
Attorney, Agent, or Firm—Fish & Richardson

[57] ABSTRACT

A process of making a heat sink which includes providing a mold having at least one cavity corresponding to the shape of the article, at least partially evacuating ambient gases from the cavity of the mold, filling the mold with thermally conductive casting material while the mold is at least partially evacuated, and solidifying the material in the mold and removing the resultant molded heat sink.

1 Claim, 2 Drawing Sheets

METHOD OF MAKING A HEAT SINK

BACKGROUND OF THE INVENTION

This invention relates to heat sinks and particularly to the method of making them.

Heat sinks commonly are attached to electronic devices (e.g., integrated circuits) to dissipate the heat which the devices generate during operation. In order to do this, the heat sinks are designed to have a maximum surface area, the size of which determines their heat dissipating capacity, while still occupying the smallest possible volume so that the heat sink takes up as little usable space as possible in the electronic assembly.

Most heat sinks have flat surfaces called fins to dissipate the heat, and one type of heat sink, called a "pin-fin" heat sink, comprises a matrix of separate pins that extend from a backing plate. In each case, the metal fins or pins serve as the heat-dissipating means for the heat sink. In many cases, the side of the backing plate opposite the fins or pins is adapted to be mounted or otherwise secured to the electronic device to be cooled. During operation, the heat sink may be further cooled by blowing air vertically or horizontally over and between the fins or pins.

Some heat sinks, including the pin fin types, are fabricated using conventional die casting techniques in which a reusable steel mold containing cavities that correspond to the fins or pins of the heat sink is filled with molten metal such as zinc or aluminum. After the metal has solidified, the heat sink is withdrawn from the mold and finished for use. However, it is difficult to assure that all the cavities are completely filled and the pins are correctly formed with this process to proper density.

As a result, the process limits the heights of the fins or pins, the number of pins per unit area, the density of the metal, and hence the cooling capacity of the heat sink.

SUMMARY OF THE INVENTION

The invention features, in one aspect, a method of making a molded article (e.g., a heat sink with a plurality of fins or pin-fins) by providing a mold having at least one cavity corresponding to the shape of the article, at least partially evacuating ambient gases from the cavity of the mold, filling the mold with molten material while the cavity is at least partially evacuated, and solidifying the material in the mold after which the resultant molded article is removed.

In the preferred embodiment, the mold has cavities that correspond to the fins or pin-fins in the heat sink to be molded. The mold is fully or partially evacuated, and thermally conductive material (e.g., aluminum) is introduced into the evacuated mold under pressure, and rapidly drawn into the entire length of the cavities. The material fills the cavities completely before it solidifies. As a result, partial filling of the mold cavities and the formation of air pockets (porosity) in the heat sink is avoided. Thus, in the finished heat sink, the fins or pin-fins have a greater bulk density, and the heat sink has increased thermal conductivity over heat sinks made in a mold at atmospheric pressure.

Other features and advantages of the invention will be apparent from the following description of the preferred embodiment and from the claims.

DESCRIPTION OF THE PREFERRED EMBODIMENT

We first briefly describe the drawings.

STRUCTURE AND OPERATION

Figure 1:
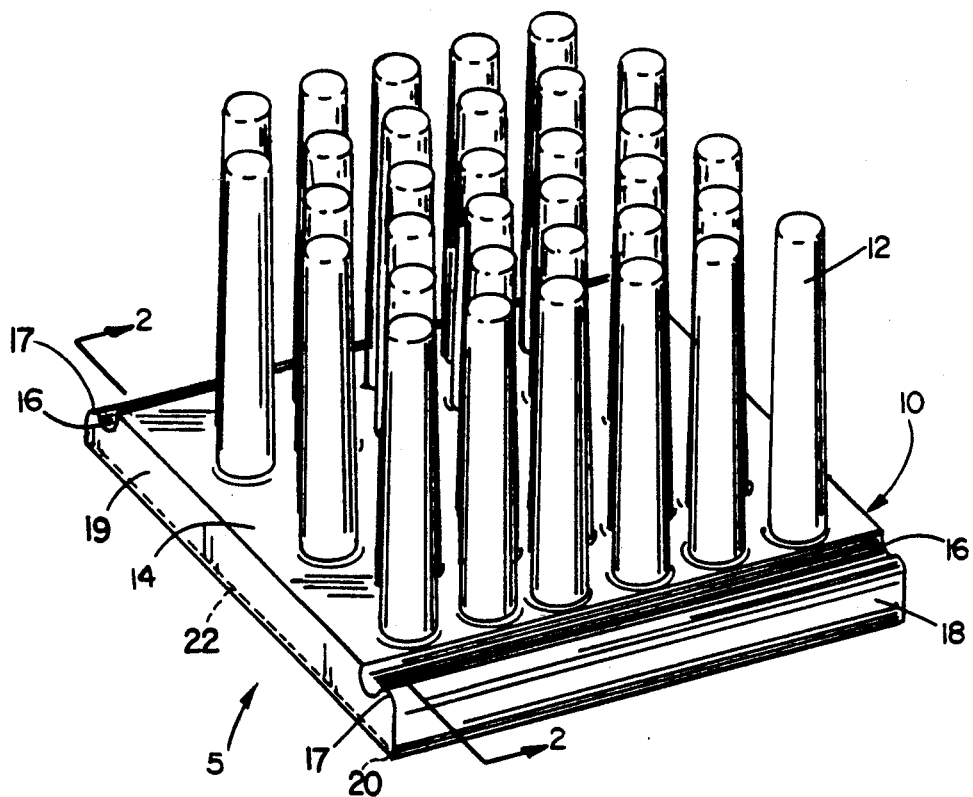
FIG. 1 is a perspective view of a pin-fin heat sink according to the invention.
Figure 2:
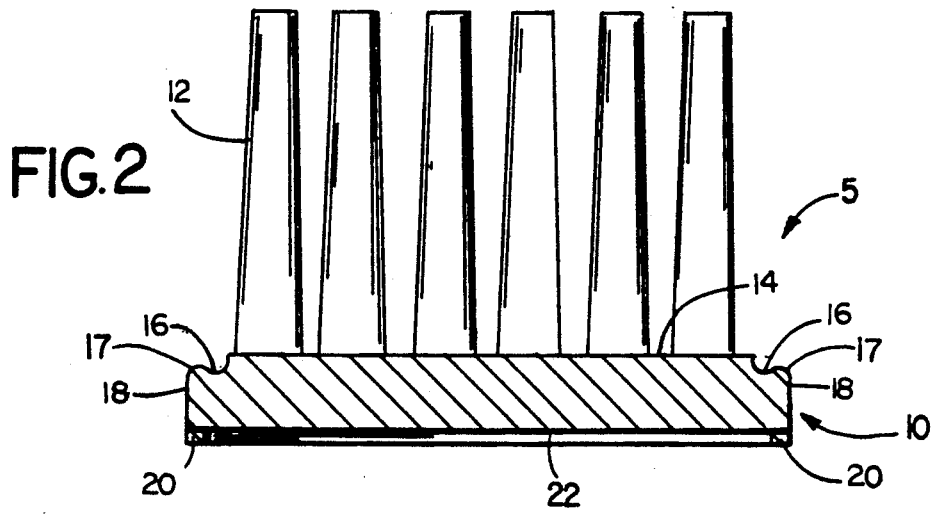
FIG. 2 is a section of a pin-fin heat sink taken along line 2—2 in FIG. 1.

Referring to FIGS. 1 and 2, a pin-fin heat sink 5 molded from thermally conductive material includes a backing plate 10. The backing plate has a front face 14, a back face 22, and two pairs of parallel side walls 18, 19. Each edge of the front face 14 adjacent to the two parallel side walls 18 terminates at an inner edge of a rounded groove 16. The outer edge of each groove 16 is rounded to form a shoulder 17. Around the perimeter of the back face 22 is a lip 20. The lip 20 and the back face 22 form a cavity 23 having dimensions selected to approximately match those of the semiconductor with which the heat sink 5 is to be used. Projecting from the front face 14 is a collection of pins 12. In operation, the pins 12 serve to dissipate heat from the semiconductor. This pin-fin type of heat sink is shown for illustrative purposes only, as other types of heat sinks may be made or used by or with the invention herein. As shown, for the preferred embodiment, the pin fin heat sink 5 has pins 12 at least 0.10 inches long, and the pins are packed at a density of at least 10 pins per square inch.

Figure 3:
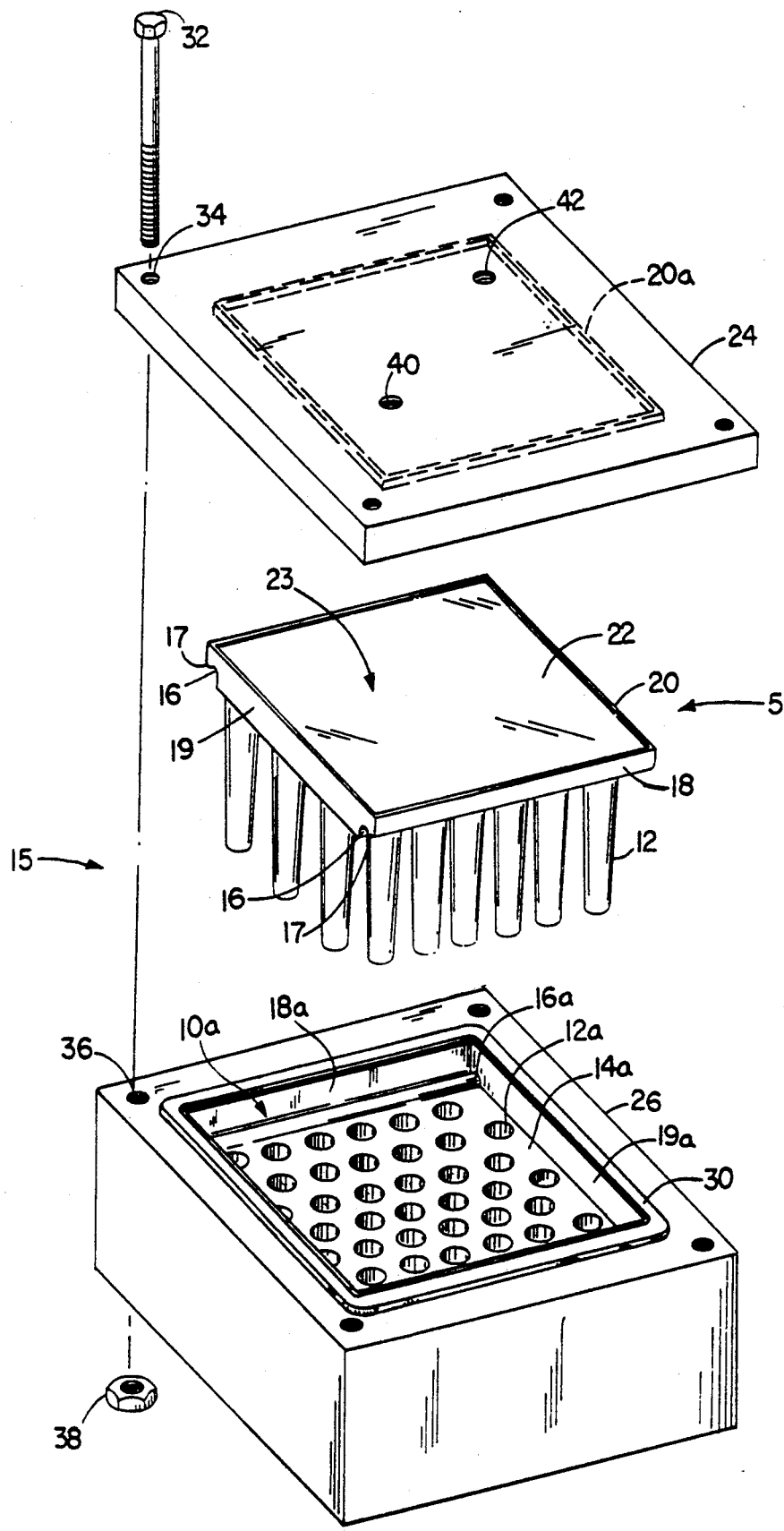
FIG. 3 is a perspective view of the pin-fin heat sink of FIG. 1 and a mold for making the heat sink.

Referring to FIG. 3, the heat sink 5 is fabricated in a mold 15 which comprises two mold halves 24 and 26. In the preferred embodiment, the mold halves 24, 26 are made of steel. Recessed in the inside surface of mold half 24 is a groove 20a (shown in phantom) which corresponds to the lip 20 of the heat sink 5. Otherwise, the bottom surface of the mold half 24 is planar. A pair of apertures 40, 42 are disposed completely through the mold half 24.

The other mold half 26 contains an array of closely packed cavities 12a which will correspond to the pins 12 in the finished heat sink 5. The cavities 12a terminate at a surface 14a, which corresponds to the front face 14 of the heat sink 5, and which is recessed in a cavity 10a that corresponds to the backing plate 10. The surface 14a is edged on two sides by a pair of rounded shoulders 16a, corresponding to the grooves 16 in the finished heat sink. Pairs of surfaces 18a and 19a, which are orthogonal to the surface 14a, correspond to heat sink sidewall pairs 18 and 19 in the finished heat sink 5. A rubber gasket 30 is disposed about the circumference of the upper surface of mold half 26.

When the mold 15 is assembled for use, mold half 26 is pressed against the mold half 24, the gasket 30 forms an air seal between the mold halves. Apertures 40, 42 communicate with the internal cavities 10a, 12a. Mold halves 24 and 26 are secured together by bolts 32 (only one shown) inserted through holes 34 and 36 in the four corners of the mold halves 24 and 26. Nuts 38 (only one shown) are used to secure the bolts 32.

A vacuum pump (not shown) is connected to aperture 40 and actuated to partially or fully remove air from the mold. While the mold 15 is under vacuum, molten thermally conductive casting material (e.g., aluminum or copper) is introduced through aperture 42. With any remaining air in the cavities 12(a) under reduced pressure, the casting material is easily drawn into the entire length of the cavities 12(a), filling them completely without the formation of trapped air, resulting in increased material bulk density (and thus greater thermal conductivity) than with conventional die casting techniques. When the casting material has solidified and cooled sufficiently, the bolts 32 are removed and the mold halves 24, 26 are separated. The molded heat sink 5 is removed from mold half 26. The resulting vacuum die cast pins (or fins) are dense castings with no interconnected porously, and as a result, have greater thermal conductively than conventionally die cast heat sinks, with a bulk density corresponding to at least 90% of the maximum specific gravity of the material used to cast the heat sink.

Other embodiments are within the following claims. For example, heat sink backing plate 10 can be as thin as possible consistent with structural requirements and the heat sink can be fabricated from any material of a high heat capacity including alloys.

What I claim is:

1. A process of making a heat sink comprising the steps of:
    providing a mold having cavities closed at one end corresponding to the heat dissipating surfaces on the heat sink;
    at least partially evacuating ambient gases from said cavities by applying a vacuum to the open end of said cavities;
    filling said mold with thermally conductive material while said mold is substantially evacuated by feeding the thermally conductive material into said mold at the open end of said cavities; and
    solidifying said thermally conductive material in said mold and removing the resultant molded heat sink.

* * * * *